(12) United States Patent
Chun et al.

(10) Patent No.: US 7,986,565 B2
(45) Date of Patent: Jul. 26, 2011

(54) METHOD OF ERASING DATA IN FLASH MEMORY DEVICE

(75) Inventors: Jin-Young Chun, Seoul (KR); Jae-Yong Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 184 days.

(21) Appl. No.: 12/458,502

(22) Filed: Jul. 14, 2009

(65) Prior Publication Data

US 2010/0118613 A1    May 13, 2010

(30) Foreign Application Priority Data

Nov. 12, 2008   (KR) .................. 10-2008-0112217

(51) Int. Cl.
*G11C 16/04*   (2006.01)
(52) U.S. Cl. ......... 365/185.29; 365/185.24; 365/185.22; 365/185.23; 365/185.14
(58) Field of Classification Search ............. 365/185.29, 365/185.24, 185.22, 185.23, 185.14
See application file for complete search history.

(56) References Cited

U.S. PATENT DOCUMENTS

| 6,466,484 | B1 | 10/2002 | Sakakibara et al. |
| 2008/0298124 | A1 * | 12/2008 | Wong ............ 365/185.03 |

FOREIGN PATENT DOCUMENTS

| KR | 10-2001-0061460 | 7/2001 |
| KR | 10-2001-0061470 | 7/2001 |

* cited by examiner

*Primary Examiner* — Thong Q Le
(74) *Attorney, Agent, or Firm* — Harness, Dickey & Pierce, P.L.C.

(57) ABSTRACT

A method of erasing data in a flash memory device, including erasing data in at least one flash memory cell using a first erase voltage; detecting whether the at least one flash memory cell has a threshold voltage less than a first voltage; programming the at least one flash memory cell by varying the threshold voltage of the at least one flash memory cell using a second voltage that is greater than the first voltage if the detecting step detects the threshold voltage is less than the first voltage; maintaining the threshold voltage of the at least one flash memory cell if the detecting step detects the threshold voltage is greater than the first voltage; and verifying the at least one flash memory cell using a first verification voltage.

28 Claims, 13 Drawing Sheets

METHOD OF ERASING DATA IN FLASH MEMORY DEVICE

PRIORITY STATEMENT

This application claims priority under 35 U.S.C. §119 to Korean Patent Application No. 10-2008-0112217, filed on Nov. 12, 2008, in the Korean Intellectual Property Office (KIPO), the entire contents of which is incorporated herein by reference.

BACKGROUND

Field

Example embodiments relate to a method of erasing data in a flash memory device, and more particularly, to a method of erasing data in a flash memory device in which threshold voltage distribution may be improved and the time taken to erase data in the flash memory device may be reduced.

Non-volatile memory devices that are electrically erasable and programmable can retain data even in a state where no power is supplied. A representative example of such non-volatile memory devices is flash memory.

SUMMARY

Example embodiments provide a method of erasing data in a flash memory device in which threshold voltage distribution may be improved and the time taken to erase data in flash memory cells may be reduced.

According to example embodiments, provided is a method for erasing data in a flash memory device, including erasing data in at least one flash memory cell using a first erase voltage; detecting whether the at least one flash memory cell has a threshold voltage less than a first voltage; programming the at least one flash memory cell by varying the threshold voltage of the at least one flash memory cell using a second voltage that is greater than the first voltage if the detecting step detects the threshold voltage is less than the first voltage; maintaining the threshold voltage of the at least one flash memory cell if the detecting step detects the threshold voltage is greater than the first voltage; and verifying the at least one flash memory cell using a first verification voltage.

According to example embodiments the method may further include repeating the erasing step, the detecting step, the programming step, the maintaining step and the verifying step if the verifying step does not verify the at least one flash memory cell.

In the detecting of the flash memory cell whose threshold voltage is less than the first voltage, the first voltage may be applied to a word line connected to a gate of the at least one flash memory cell, and then it may be determined whether the threshold voltage of the flash memory cell is less than the first voltage based on whether a current flows through the flash memory cell.

The detecting of the flash memory cell whose threshold voltage is less than the first voltage and the programming of the at least one flash memory cell may be performed on the flash memory cells connected to the same bit line.

The detecting of the flash memory cell whose threshold voltage is less than the first voltage and the programming of the at least one flash memory cell may be performed on the flash memory cells connected to the same word line.

The method of erasing data in a flash memory device may further include programming the at least one flash memory cell using a programming voltage before the erasing of the data in the at least one flash memory cell.

The method of erasing data in a flash memory device may further include programming the at least one flash memory cell using a programming voltage after the verifying of the at least one flash memory cell has been completed.

According example embodiments, provided is a method for erasing data in a flash memory device, including erasing data in at least one flash memory cell using a first erase voltage; verifying the at least one flash memory cell using a first verification voltage; erasing the data in the at least one flash memory cell using a second erase voltage; detecting whether the at least one flash memory cell has a threshold voltage less than a first voltage; programming the at least one flash memory cell by varying the threshold voltage of the at least one flash memory cell using a second voltage that is greater than the first voltage if the detecting step detects the threshold voltage is less than the first voltage; maintaining the threshold voltage of the at least one flash memory cell if the detecting step detects the threshold voltage is greater than the first voltage; and verifying the at least one flash memory cell using a second verification voltage.

According example embodiments, provided is a memory card, including a flash memory array; and a memory controller. The memory controller is configured to erase data in at least one flash memory cell of the flash memory array using a first erase voltage, detect whether the at least one flash memory cell has a threshold voltage less than a first voltage, program the at least one flash memory cell by varying the threshold voltage of the at least one flash memory cell using a second voltage that is greater than the first voltage if the detected threshold voltage is less than the first voltage, maintain the threshold voltage of the at least one flash memory cell if the detected threshold voltage is greater than the first voltage, and verify the at least one flash memory cell using a first verification voltage.

According example embodiments, provided is a system including a bus; a non-volatile memory system connected to the bus, the non-volatile memory system including, a flash memory array, and a memory controller. The memory controller is configured to erase data in at least one flash memory cell of the flash memory array using a first erase voltage, detect whether the at least one flash memory cell has a threshold voltage less than a first voltage, program the at least one flash memory cell by varying the threshold voltage of the at least one flash memory cell using a second voltage that is greater than the first voltage if the detected threshold voltage is less than the first voltage, maintain the threshold voltage of the at least one flash memory cell if the detected threshold voltage is greater than the first voltage, and verify the at least one flash memory cell using a first verification voltage. The system further includes a random access memory connected to the bus; a user interface connected to the bus; a modem connected to the bus; and a central processing unit connected to the bus, the central processing unit configured to communicate with the non-volatile memory system, the random access memory, the user interface and the modem via the bus.

BRIEF DESCRIPTION OF THE DRAWINGS

Example embodiments will be more clearly understood from the following brief description taken in conjunction with the accompanying drawings. FIGS. 1-11 represent non-limiting, example embodiments as described herein.

FIG. 1 is a flowchart of a method of erasing data in a flash memory device according to an example embodiment;

FIG. 5 is a circuit diagram showing voltage levels applied to flash memory cells when a flash memory cell whose threshold voltage is smaller than the first voltage is not detected;

FIG. 6 is a flowchart of a method of erasing data in a flash memory device according to an example embodiment;

FIG. 8 is a circuit diagram of a flash memory cell array to which the method of FIG. 1 or 6 according to example embodiments may be applied;

FIG. 9 is a block diagram of a flash memory device according to an example embodiment;

FIG. 10 is a block diagram of a memory card according to an example embodiment; and FIG. 11 is a block diagram of an information processing system according to an example embodiment.

Figure 1:
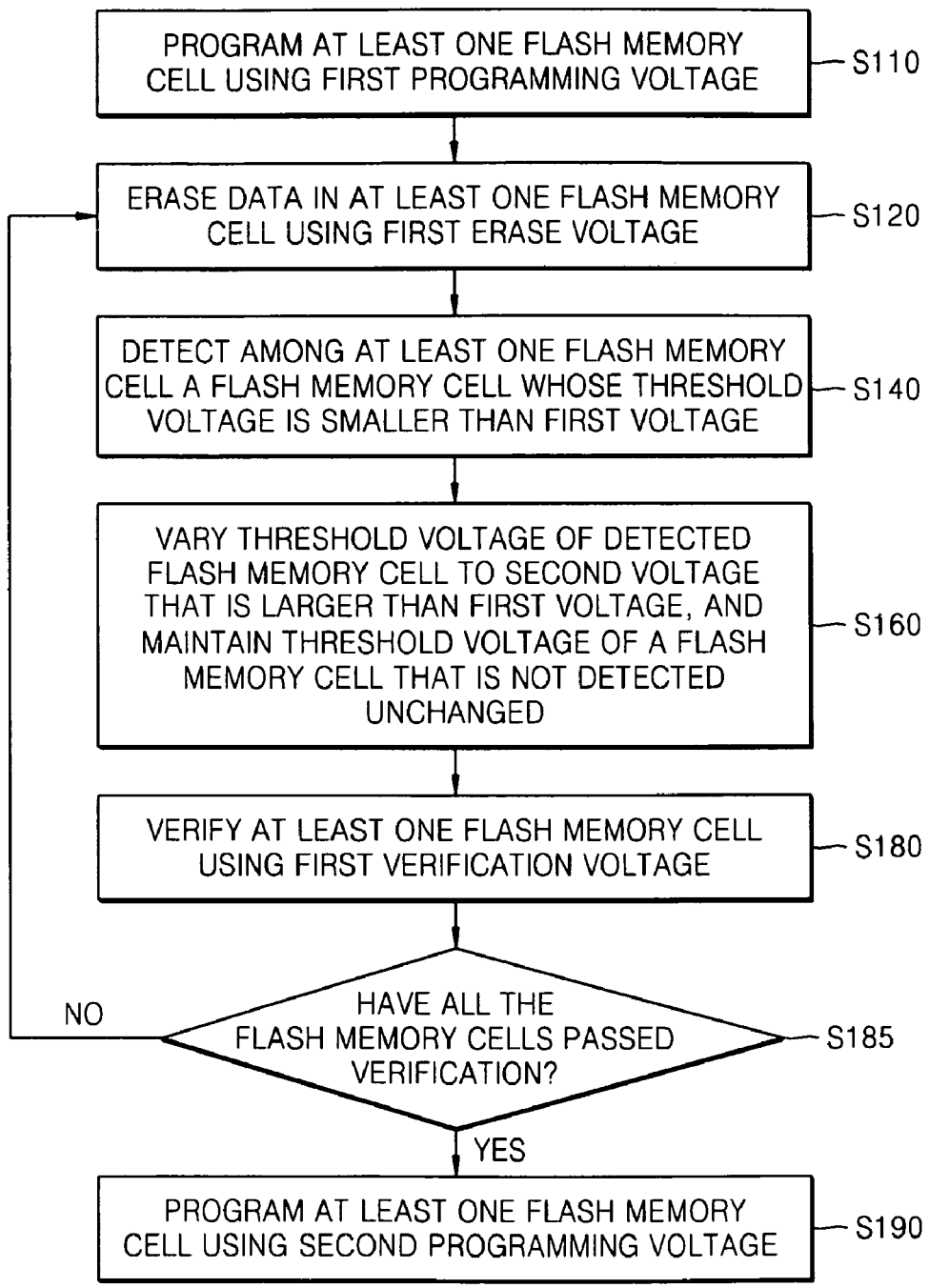

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A flash memory device stores data by storing charges. Each memory cell of the flash memory device may include cell transistors each of which may have a control gate, a charge storage layer, a source, and a drain. The flash memory device may vary a data value written to a memory cell by controlling the amount of charges in the charge storage layer.

The state where a cell transistor has a negative threshold voltage due to negative charges in the charge storage layer may be called the "erase" state. The state where a cell transistor has a positive threshold voltage as charges are injected into the charge storage layer may be called the "program" state.

The threshold voltage of the cell transistor may be varied by controlling the amount of charges in the charge storage layer. To control the amount of charges in the charge storage layer, hot electrons may be injected into or may be drained out of the charge storage layer.

Figure 2A:
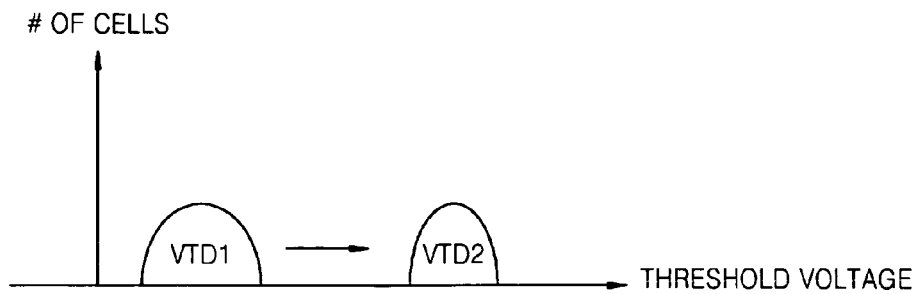
FIGS. 2A through 2G are graphs of variations in the threshold voltage distribution of flash memory cells in the method of FIG. 1.
Figure 2B:
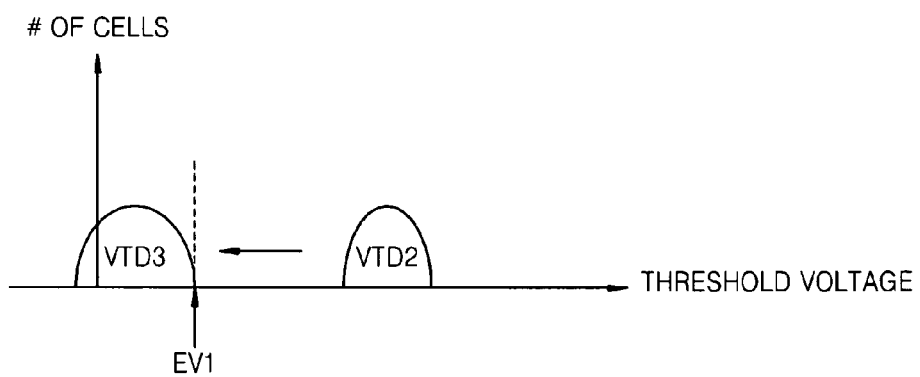

FIG. 1 is a flowchart of a method of erasing data in a flash memory device according to an example embodiment. FIGS. 2A through 2G are graphs of variations in the threshold voltage distribution of flash memory cells in the method of FIG. 1. FIGS. 3A and 3B are circuit diagrams showing voltage levels applied to the flash memory cells in the method of FIG. 1.

The method according to example embodiments may include programming at least one flash memory cell using a first programming voltage (S110 in FIG. 1). Referring to FIG. 2A, when the threshold voltage of the flash memory cell belongs to a threshold voltage distribution VTD1, the threshold voltage of the flash memory cell is increased to be within a threshold voltage distribution VTD2. The first programming voltage may be a voltage in the threshold voltage distribution VTD2. The threshold voltage of the flash memory cell may be varied by applying the first programming voltage to a gate of the flash memory cell. The first programming voltage may be applied through a word line connected to the gate of the flash memory cell.

Alternatively, the method of erasing data in a flash memory device, according to example embodiments, may begin with operation S120 in FIG. 1, described below, without performing operation S110. In other words, even in the state where the flash memory cell has not been programmed using the first programming voltage, data in the flash memory cell may be erased (S120 in FIG. 1).

Data in the at least one flash memory cell may be erased using a first erase voltage (S120 in FIG. 1). Referring to FIG. 2B, in the state where the threshold voltage of the flash memory cell has increased to be within the threshold voltage distribution VTD2, the threshold voltage of the flash memory cell is reduced to the first erase voltage or less to be within a threshold voltage distribution VTD3. The threshold voltage of the flash memory cell may be reduced to the first erase voltage or less by applying the first erase voltage to a semiconductor substrate in which the flash memory cell is formed.

When programming the flash memory cell using the first programming voltage (S110 in FIG. 1) is not performed, the threshold voltage of the flash memory cell may have an arbitrary value. For Example, the arbitrary value for the threshold voltage of the flash memory cell may be reduced to a value less than the first erase voltage in order to be within the threshold voltage distribution VTD3 (S120 in FIG. 1).

A flash memory cell whose threshold voltage is less than a first voltage V1 may be detected among the data-erased flash memory cells (S140 in FIG. 1). In other words, an over data-erased flash memory cell is detected. For example, the first voltage V1 may be a ground voltage (0V).

Figure 2C:
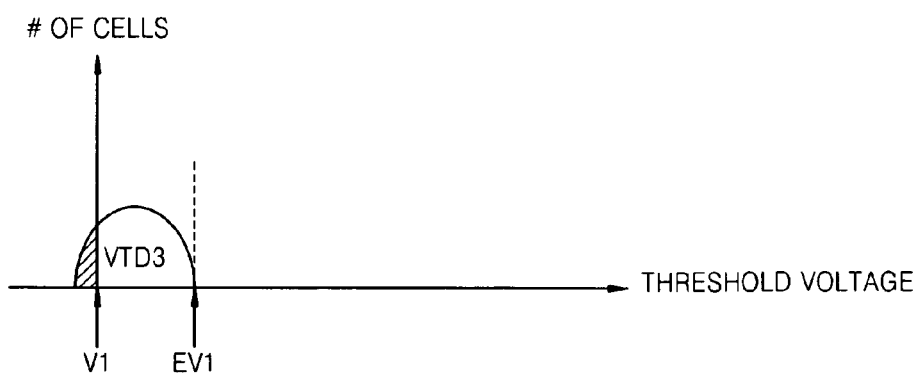
Figure 3A:
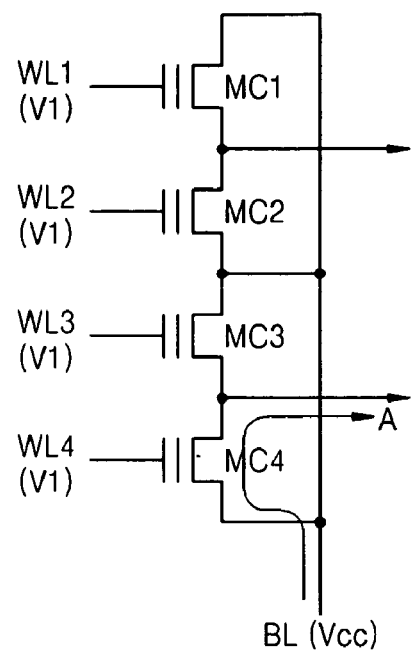
FIGS. 3A and 3B are circuit diagrams showing voltage levels applied to flash memory cells in the method of FIG. 1.
Figure 3B:
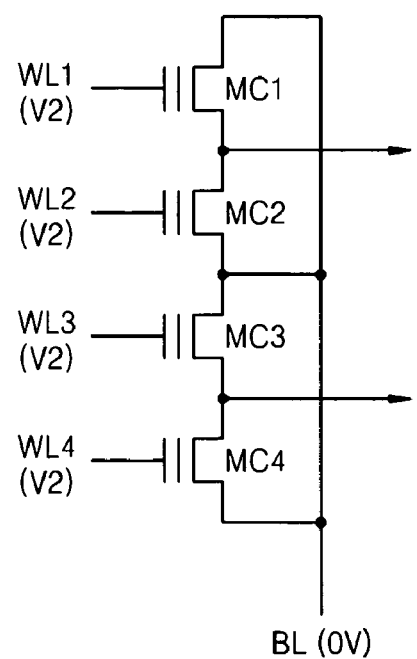

Referring to FIG. 2C, a portion with oblique lines in the threshold voltage distribution VTD3 denotes an over erased portion in which the threshold voltage of the flash memory cell is less than the first voltage V1, for example, a ground voltage. In other words, the flash memory cell whose threshold voltage belongs to the portion with oblique lines in the threshold voltage distribution VTD3 is detected in operation S140 in FIG. 1.

Referring to FIG. 3A, the first voltage V1 is applied to word lines WL1~WL4 respectively connected to the gates of flash memory cells MC1~MC4, and whether a current flows through the flash memory cells MC1~MC4 may be detected. A voltage Vcc applied to a bit line BL connected to the flash memory cells MC1~MC4 may have a voltage level that allows a current to flow through the flash memory cells MC1~MC4. FIG. 3A illustrates an example in which a current flows through the flash memory cell MC4 but does not flow through the flash memory cells MC1~MC3.

If a current flows through the flash memory cell MC4, the threshold voltage of the flash memory cell MC4 may be determined to be less than the first voltage V1. If a current does not flow through the flash memory cells MC1~MC3, the threshold voltages of the flash memory cells MC1~MC3 may be determined to be greater than the first voltage V1. This is because a current flows through the flash memory cells MC1~MC4 if a voltage applied to the gates of the flash memory cells MC1~MC4 is greater than the threshold voltages of the flash memory cells MC1~MC4, and a current does not flow through the flash memory cells MC1~MC4 if a voltage applied to the gates of the flash memory cells MC1~MC4 is less than the threshold voltages of the flash memory cells MC1~MC4.

In this example, the threshold voltage of the flash memory cell (MC4) is less than the first voltage V1, and the threshold voltages of the flash memory cells MC1~MC3 are greater than the first voltage V1. Alternatively, a flash memory cell whose threshold voltage is less than the first voltage V1 may not be detected as described below with reference to FIGS. 4 and 5.

Although it is illustrated in FIG. 3A that the first voltage V1 is applied to the four word lines WL1~WL4, the first voltage V1 may be applied to a specific word line, for example, WL4. The specific word line may be a word line that is connected to a target flash memory cell, for example, MC4, from which the threshold voltage will be detected. Thus, it can be checked whether the threshold voltage of the target flash memory cell, for example, MC4, is less than the first voltage V1.

The threshold voltage of the flash memory cell that is less than the first voltage V1 may be increased to a second voltage V2 (S160 in FIG. 1). The second voltage V2 is greater than the first voltage V1. In addition, the threshold voltage of a flash memory cell that is greater than the first voltage V1 remains unchanged (S160 in FIG. 1).

Figure 2D:
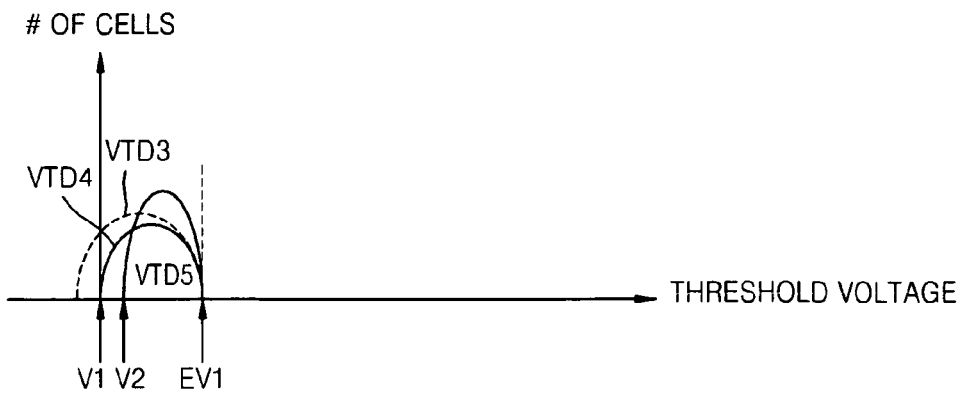

Referring to FIG. 2D, in the state where the threshold voltage of the flash memory cell is within the threshold voltage distribution VTD3, the threshold voltage of the flash memory cell is increased to be within a threshold voltage distribution VTD4 or VTD5. In other words, the threshold voltage of the flash memory cell that is less than the first voltage V1 is increased to be greater than the first voltage V1 (i.e. to be within the threshold voltage distribution VTD4) or to be greater than the second voltage V2 (i.e., to be within the threshold voltage distribution VTD5).

The flash memory cell is programmed to have either a threshold voltage that is greater than the first voltage (V1) and belongs to the threshold voltage distribution VTD4 or a threshold voltage that is greater than the second voltage V2 and belongs to the threshold voltage distribution VTD5. The lowest voltage in the threshold voltage distribution VTD4 may be greater than the first voltage V1, and the lowest voltage in the threshold voltage distribution VTD5 may be greater than the second voltage V2. In an example illustrated in FIG. 2D, the first voltage V1 and the second voltage V2 are the lowest voltages in the threshold voltage distributions VTD4 and VTD5.

Referring to FIG. 3B, the threshold voltage of a flash memory cell that is less than the first voltage V1 may be increased to be within the threshold voltage distribution VTD5 by applying the second voltage V2 to the word lines WL1~WL4 respectively connected to the gates of the flash memory cells MC1~MC4 and applying a ground voltage of 0V to the bit line BL connected to the flash memory cells MC1~MC4. Alternatively, the threshold voltage of a flash memory cell that is greater than the first voltage V1 may be increased to be within the threshold voltage distribution VTD4 by applying the first voltage V1, instead of the second voltage V2, to the word lines WL1~WL4.

The programming operation may be selectively performed only on the flash memory cell whose threshold voltage is less than the first voltage V1. For example, assuming the threshold voltage of the flash memory cell MC4 is detected to be less than the first voltage V1 and the threshold voltages of the flash memory cells MC1~MC3 are detected to be greater than the first voltage V1, as in FIG. 3A. The threshold voltage of the flash memory cell MC4 may be increased to be greater than the second voltage V2 or the first voltage V1, and the threshold voltages of the flash memory cells MC1~MC3 may remain unchanged.

Although tit is illustrated in FIG. 3B that the second voltage V2 is applied to the four word lines WL1~WL4, the second voltage V2 may be applied to a specific word line, for example, WL4. The specific word line may be a word line that is connected to a flash memory cell, for example, MC4, whose threshold voltage is less than the first voltage V1. Thus, the flash memory cell MC4 whose threshold voltage is less than the first voltage V1 may be selectively programmed.

If a flash memory cell whose threshold voltage is less than the first voltage V1 is not detected in S140 of FIG. 1, operation S160 may be performed in a different way. This will be described below with reference to FIGS. 4 and 5.

Figure 2E:
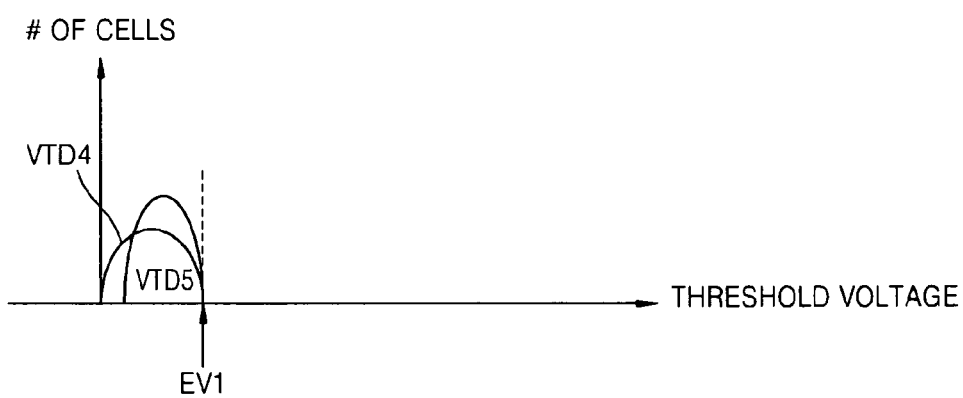

At least one flash memory cell is verified using a first verification voltage EV1 (S180 in FIG. 1). Referring to FIG. 2E, the threshold voltage of the at least one flash memory cell being less than the first verification voltage EV1 is verified. The threshold voltage of the at least one flash memory cell may be verified by supplying a desired (or, alternatively a predetermined) amount of current to the flash memory cell through the bit line.

If, in the operation of verifying the at least one flash memory cell (S180 in FIG. 1), it is determined that the at least one flash memory cell includes a defective flash memory cell (failure of all of the flash memory cells to pass the verification operation in operation S185 of FIG. 1), the process goes back to the operation of erasing data in the at least one flash memory cell (S120 in FIG. 1), the operation of detecting a flash memory cell whose threshold voltage is less than the first voltage V1 (S140 in FIG. 1), the selective programming operation (S160 in FIG. 1), and the operation of verifying the at least one flash memory cell (S180 in FIG. 1). However, it is optional to perform the operation of detecting the flash memory cell whose threshold voltage is less than the first voltage V1 (S140 in FIG. 1) and the selective programming operation (S160 in FIG. 1).

Figure 2F:
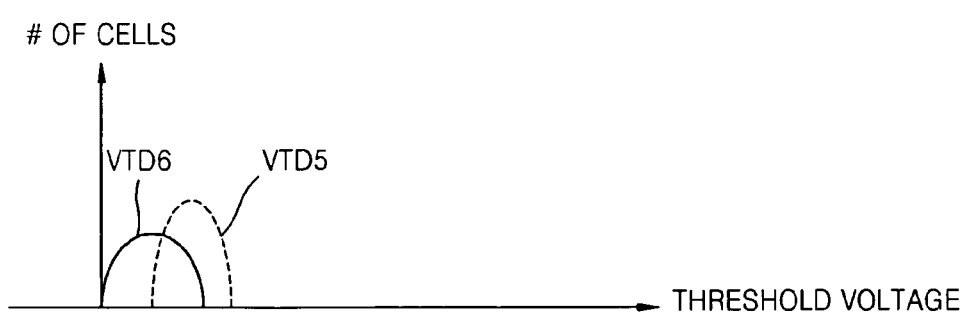
Figure 2G:
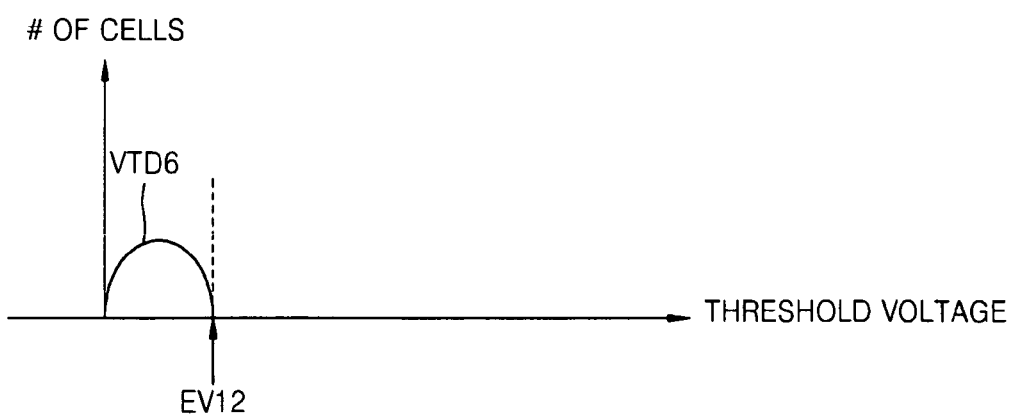

Referring to FIG. 2F, the threshold voltage of the at least one flash memory cell that is within the threshold voltage distribution VTD5 are decreased to be within a threshold voltage distribution VTD6 (erase operation). An erase voltage used in this operation may be different from the first erase voltage. Referring to FIG. 2G, the at least one flash memory cell is verified using a verification voltage EV12. The verification voltage EV12 may be different from the first verification voltage EV1. For example, the verification voltage EV12 may be less than the first verification voltage EV1.

If all the flash memory cells have passed the verification operation (S180 in FIG. 1) in operation S185 of FIG. 1, the flash memory cells may be programmed using a second programming voltage (S190 in FIG. 1). However, the method of erasing data in a flash memory device according to the example embodiment may end with operation S180 in FIG. 1, without performing operation S190 in FIG. 1.

Figure 4A:
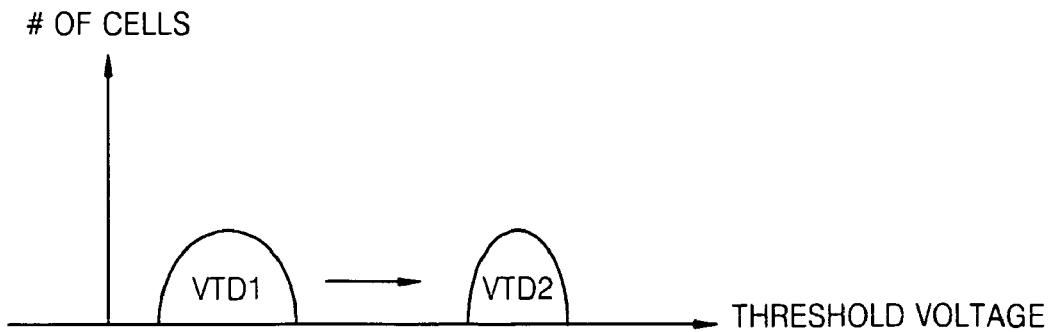
FIGS. 4A through 4C are graphs of variations in the threshold voltage distribution of the flash memory cells when a flash memory cell whose threshold voltage is smaller than a first voltage is not detected.
Figure 4B:
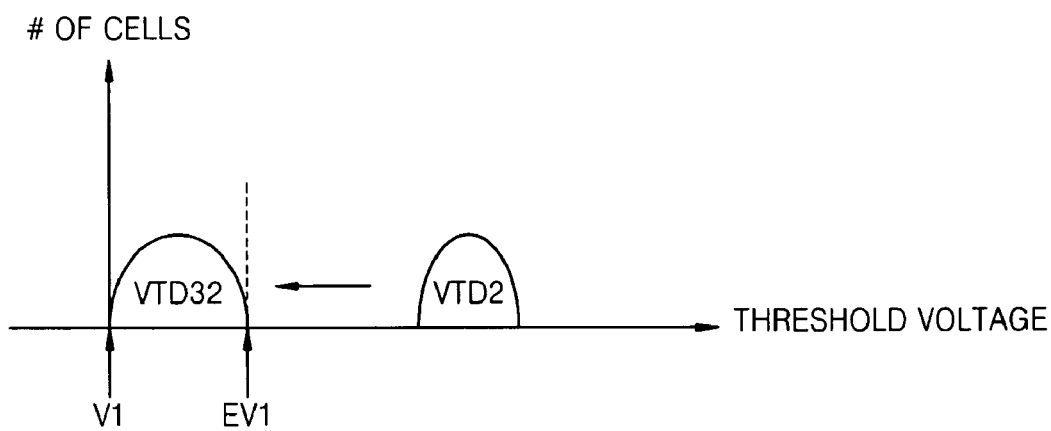
Figure 4C:
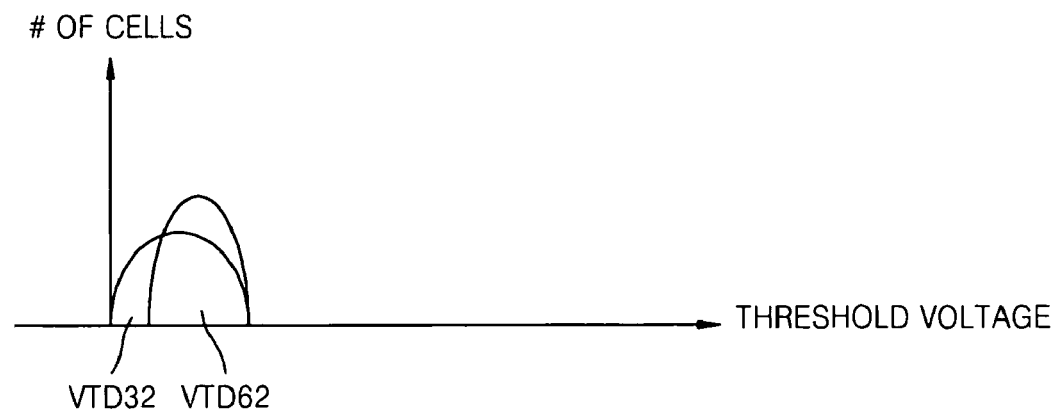
Figure 5:
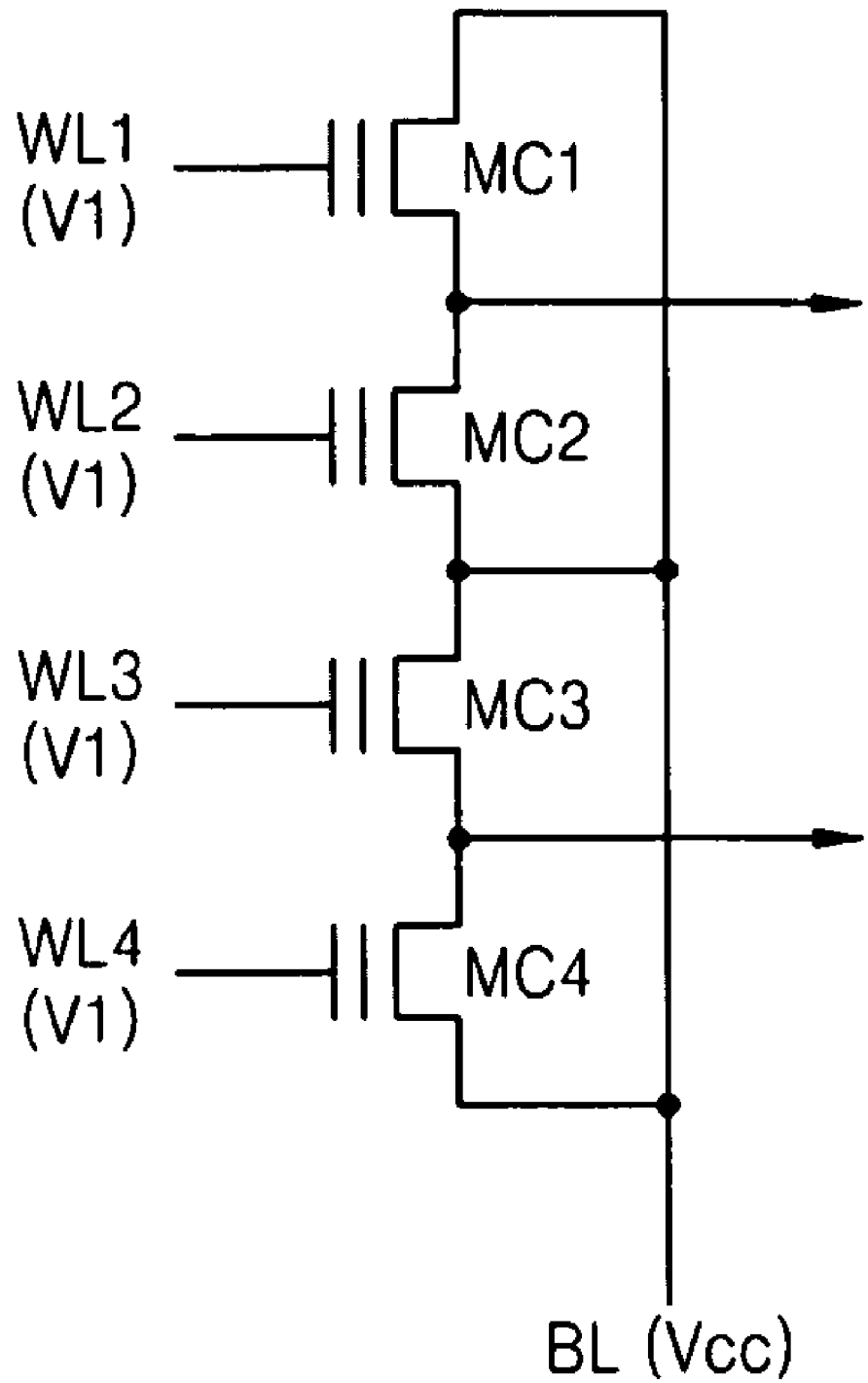

FIGS. 4A through 4C are graphs of variations in the threshold voltage distribution of the flash memory cells when a flash memory cell whose threshold voltage is less than the first voltage V1 is not detected. FIG. 5 is a circuit diagram showing voltage levels applied to the flash memory cells when a flash memory cell whose threshold voltage is less than the first voltage V1 is not detected.

FIG. 4A illustrates an example of programming flash memory cells using the first programming voltage (S110 in FIG. 1). Referring to FIG. 4A, when the threshold voltage of the flash memory cell belongs to a threshold voltage distribution VTD1, the threshold voltage of the flash memory cell is increased to be within a threshold voltage distribution VTD2. The first programming voltage may be a voltage in the threshold voltage distribution VTD2. The threshold voltage of the flash memory cell may be varied by applying the first programming voltage to a gate of the flash memory cell. The first programming voltage may be applied through a word line connected to the gate of the flash memory cell.

Referring to FIG. 4B, in the state where the threshold voltage of the flash memory cell has increased to be within the threshold voltage distribution VTD2, the threshold voltage of the flash memory cell may be reduced to the first erase voltage or less to be within a threshold voltage distribution VTD32. The threshold voltage of the flash memory cell may be reduced to the first erase voltage or less by applying the first erase voltage to a semiconductor substrate in which the flash memory cell is formed.

As a result of erasing data in at least one flash memory cell using the first erase voltage (S120 in FIG. 1) and detecting among the data-erased flash memory cells a flash memory cell whose threshold voltage is less than the first voltage V1 (S140 in FIG. 1), the flash memory cell whose threshold voltage is less than the first voltage V1 was not detected. In other words, the threshold voltages of all the data-erased flash memory cells are within a threshold voltage distribution VTD32.

Referring to FIG. 5, the first voltage V1 is applied to the word lines WL1~WL4 respectively connected to the gates of the flash memory cells MC1~MC4, a voltage Vcc is applied to a bit line BL connected to the flash memory cells MC1~MC4, and whether a current flow through the flash memory cells MC1~MC4 may be detected. Because the threshold voltages of the flash memory cells MC1~MC4 are greater than the first voltage V1, a current does not flow through the flash memory cells MC1~MC4 (refer to FIG. 5).

As described above, when a flash memory cell whose threshold voltage is less than the first voltage V1 is not detected in S140 of FIG. 1, the operation of varying the threshold voltage of the at least one flash memory cell to the second voltage V2 may not be performed (S160 in FIG. 1). Thus, the time taken to erase data in the flash memory cells may be reduced.

The at least one flash memory cell may be programmed using the second programming voltage (S190 in FIG. 1). FIG.

6 is a flowchart of a method of erasing data in a flash memory device according example embodiments. FIGS. 7A through 7G are graphs of variations in the threshold voltage distribution of flash memory cells in the method of FIG. 6.

Figure 6:
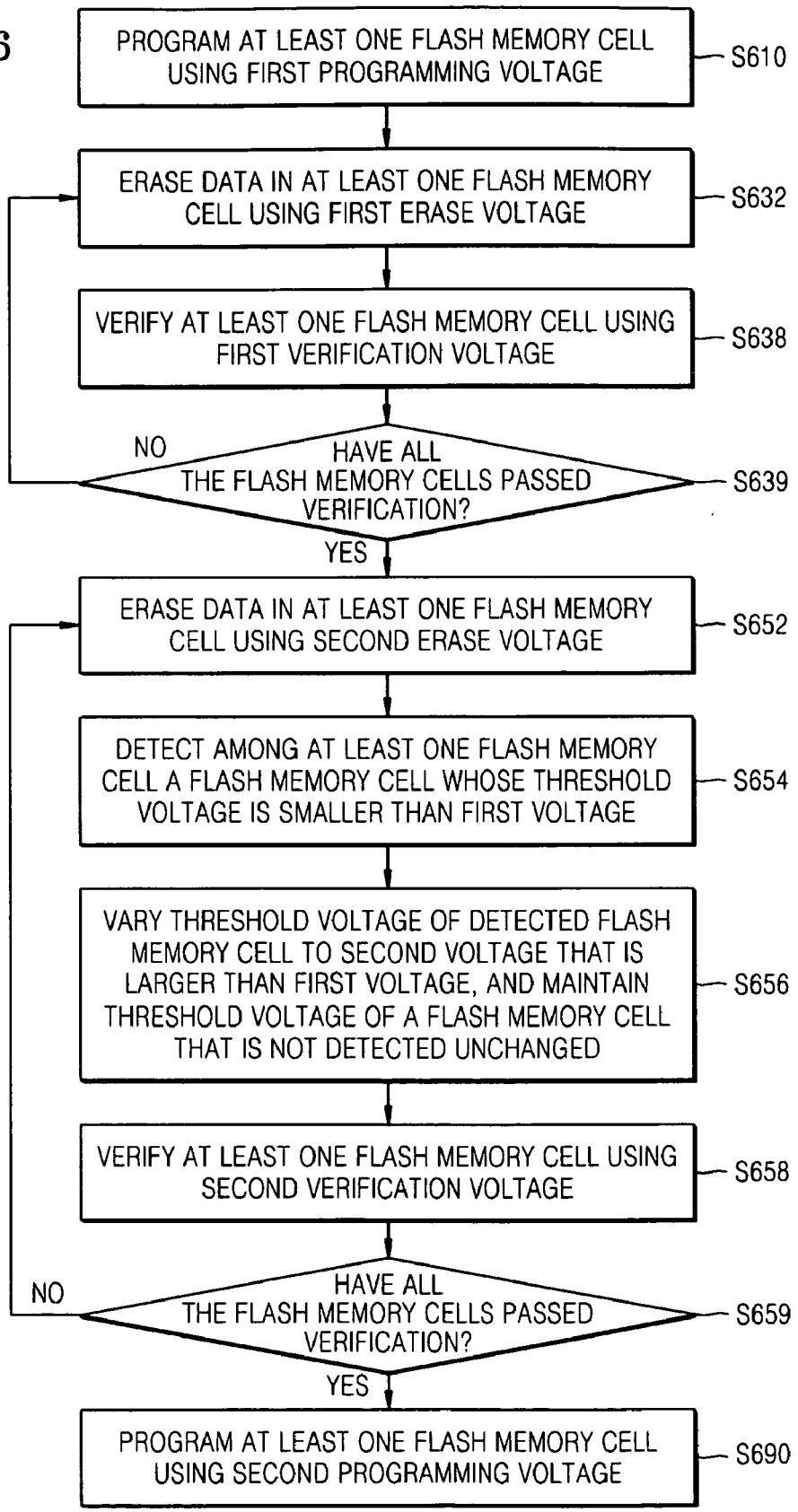
Figure 7A:
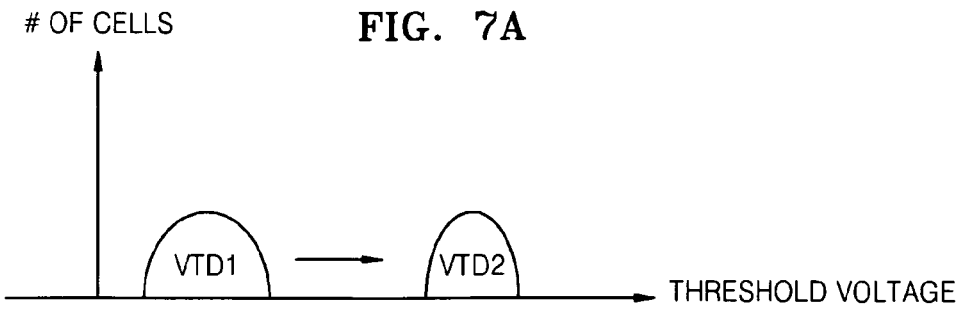
FIGS. 7A through 7G are graphs of variations in the threshold voltage distribution of flash memory cells in the method of FIG. 6.

The method of erasing data in a flash memory device, according to example embodiments, includes programming at least one flash memory cell using a first programming voltage (S610 in FIG. 6). Referring to FIG. 7A, in the state where the threshold voltage of the at least one flash memory cell is within a threshold voltage distribution VTD1, the threshold voltage of the at least one flash memory cell is increased to be within a threshold voltage distribution VTD2. Operation S610 in FIG. 6 and FIG. 7A are respectively identical with operation S110 in FIG. 1 and FIG. 2A, and thus detailed descriptions thereof will be omitted.

Figure 7B:
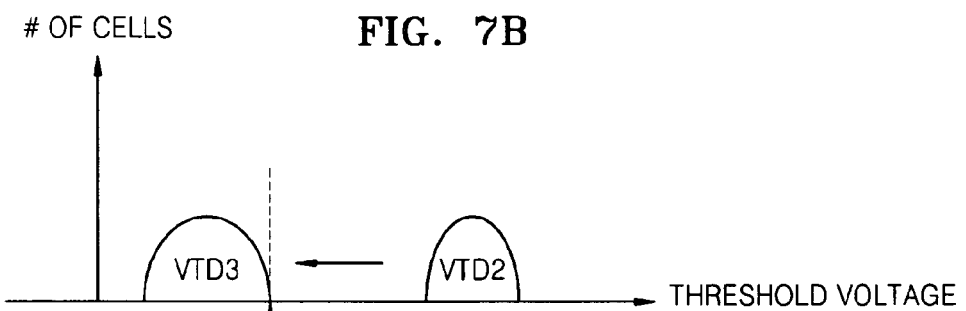

Data in the at least one flash memory cell is erased using a first erase voltage (S632 in FIG. 6). Referring to FIG. 7B, in the state where the threshold voltage of the flash memory cell has increased to be within a threshold voltage distribution VTD2, the threshold voltage of the flash memory cell is reduced to be less than the first erase voltage EV1 to be within a threshold voltage distribution VTD3. Operation S632 in FIG. 6 and FIG. 7B are respectively identical with operation S120 in FIG. 1 and FIG. 2B, and thus detailed descriptions thereof will be omitted.

In the method of erasing data in a flash memory device according to example embodiment, detecting among the data-erased flash memory cells a flash memory cell whose threshold voltage is less than the first voltage V1 (as in S140 of FIG. 1) and increasing the threshold voltage of the flash memory cell whose threshold voltage is less than the first voltage V1 (as in S160 of FIG. 1) to the second voltage V2 are not performed. In other words, after the data in the at least one flash memory cell has been erased using the first erase voltage (S632 in FIG. 6), the at least one flash memory cell is verified using the first erase voltage (S638 in FIG. 6), without performing the operations that correspond to S140 and S160 in FIG. 1.

If, in the operation of verifying the at least one flash memory cell (S638 in FIG. 6) it is determined that the at least one flash memory cell includes a defective flash memory cell (failure of all of the flash memory cells to pass the verification operation in operation S639 of FIG. 6), the process may go back to the operation of erasing data in the at least one flash memory cell (S632 in FIG. 6) and the operation of verifying the at least one flash memory cell (S638 in FIG. 6).

Figure 7C:
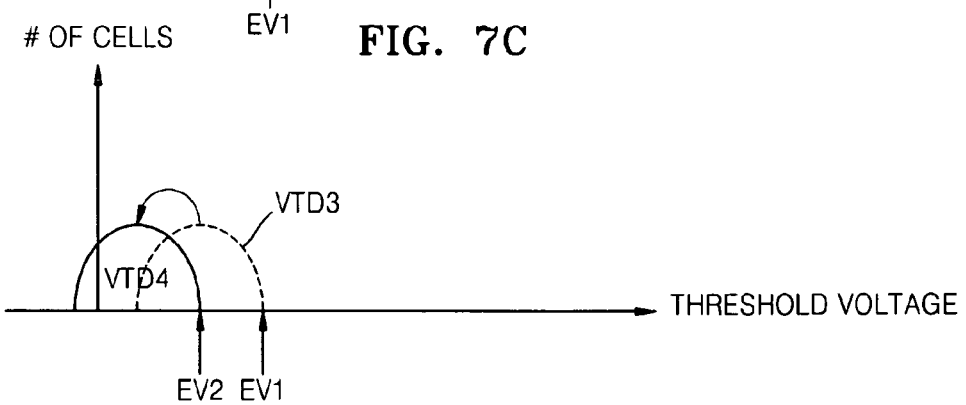

If all the flash memory cells have passed the verification operation (S638 in FIG. 6) in operation S639 of FIG. 6, data in the flash memory cells may be erased using a second erase voltage EV2 (S652 in FIG. 6). Referring to FIG. 7C, the threshold voltage of the flash memory cell is reduced to be less than the second erase voltage EV2 to be within a fourth threshold voltage distribution VTD4.

Figure 7D:
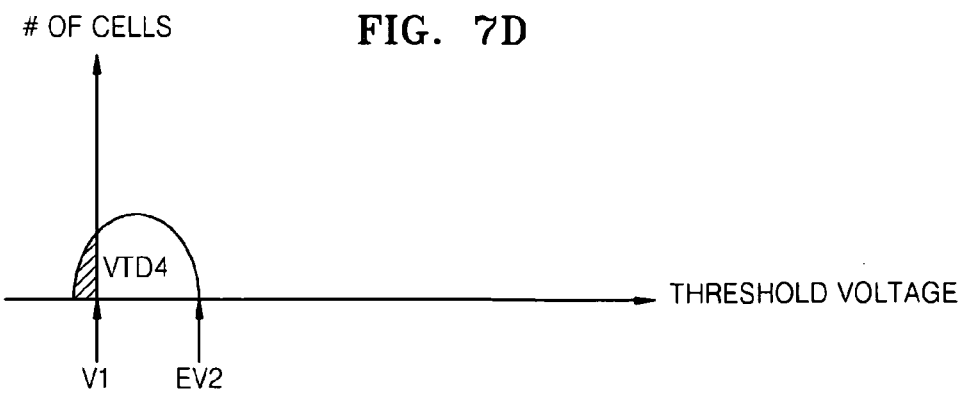

A flash memory cell (over data-erased flash memory cell) whose threshold voltage is less than the first voltage V1 may be detected among the erased flash memory cells (S654 in FIG. 6). Referring to FIG. 7D, a flash memory cell whose threshold voltage is within a portion with oblique lines in the threshold voltage distribution VTD4 is detected.

Figure 7E:
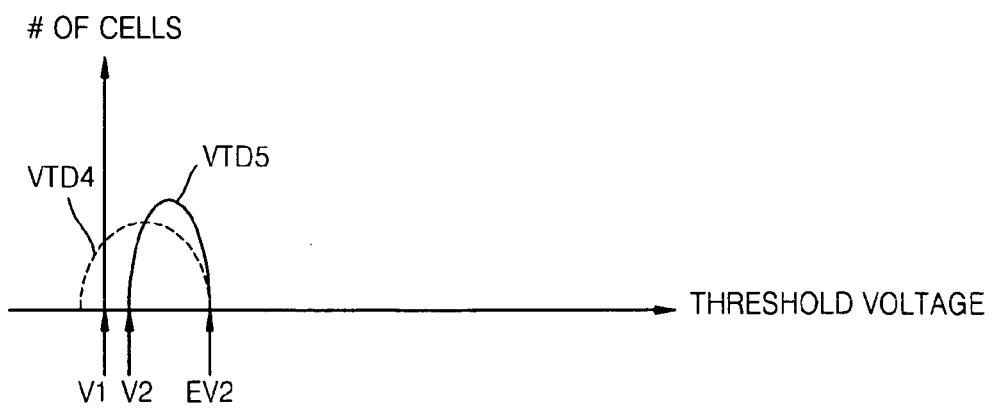

The threshold voltage of the flash memory cell that is less than a first voltage V1 is increased to a second voltage V2 (S656 in FIG. 6). In other words, the flash memory cell is programmed to have a threshold voltage that is greater than a second voltage V2 and belongs to the threshold voltage distribution VTD5. Referring to FIG. 7E, in the state where the threshold voltage of the flash memory cell is within the threshold voltage distribution VTD4, the threshold voltage of the flash memory cell is increased to be within the threshold voltage distribution VTD5.

Figure 7F:
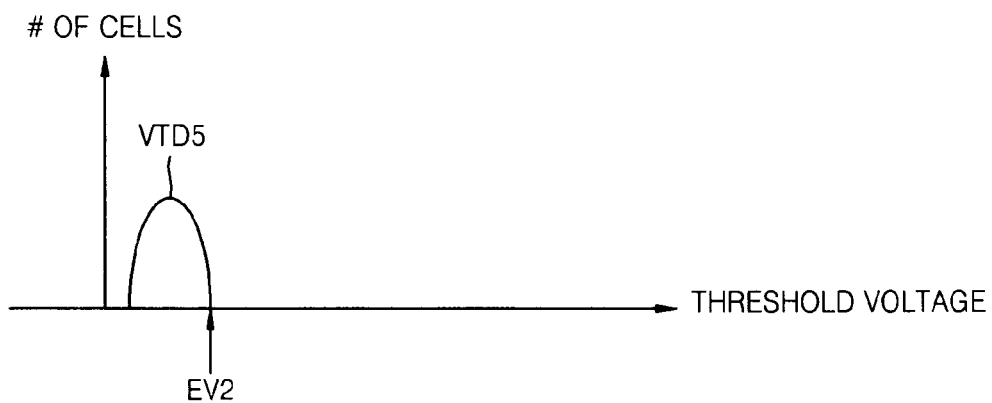
Figure 7G:
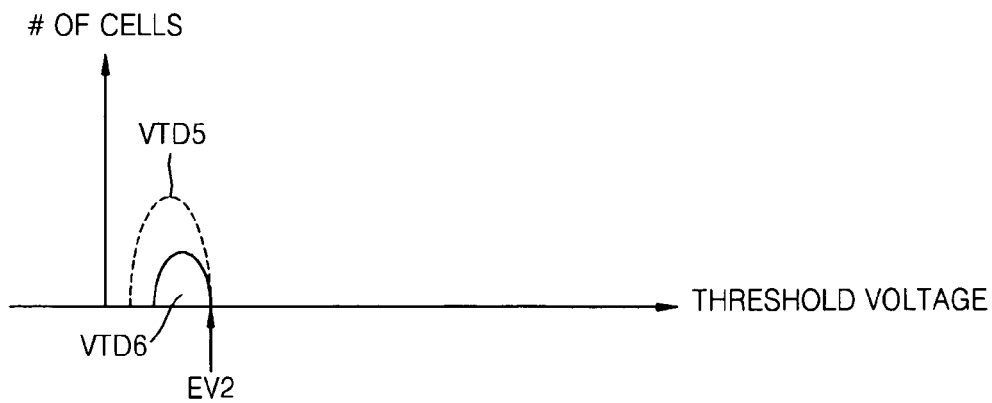

The at least one flash memory cell may be verified using a second verification voltage EV2 (operation S658 in FIG. 6). Referring to FIG. 7F, whether the threshold voltage of the at least one flash memory cell being less than the second verification voltage EV2 is verified. The threshold voltage of the at least one flash memory cell may be verified by supplying a desired (or, alternatively a predetermined) amount of current to the flash memory cells through the bit line.

If it is determined in the operation of verifying the flash memory cells (S658 in FIG. 6) that the at least one flash memory cell includes a defective flash memory cell (failure of all of the flash memory cells to pass the verification operation in operation S659 of FIG. 6), the process goes back to the operation of erasing data in the at least one flash memory cell (S652 in FIG. 6), the operation of detecting a flash memory cell whose threshold voltage is less than a first voltage V1 (S654 in FIG. 6), the selective programming operation (S656 in FIG. 6), and the operation of verifying the at least one flash memory cell (S658 in FIG. 6). However, performing the operation of detecting a flash memory cell whose threshold voltage is less than a first voltage V1 (S654 in FIG. 6) and the selective programming operation (S656 in FIG. 6) are optional.

If all the flash memory cells have passed the verification operation (S658 in FIG. 6) in operation S659 of FIG. 6, the flash memory cells may be programmed using a second programming voltage (S690 in FIG. 6). However, the method of erasing data in a flash memory device according to example embodiments may end with operation S658 in FIG. 6, without performing operation S690 in FIG. 6. A detailed description of each of the operations in FIG. 6 will be omitted because the operations are substantially the same as the operations described above with reference to FIG. 1.

In the method of erasing data in a flash memory device according to the current example embodiment, performing the operation of detecting among the data-erased flash memory cells a flash memory cell whose threshold voltage is less than the first voltage V1 (S654 of FIG. 6) and the operation of increasing the threshold voltage of the flash memory cell whose threshold voltage is less than the first voltage V1 to the second voltage V2 (S656 of FIG. 6) are optional. In other words, operations S654 and S656 in FIG. 6 may be performed when data in the flash memory cells are likely to be over erased. For example, assuming that the second erase voltage EV2 is less than the first erase voltage EV1 as above, when erasing is performed using the second erase voltage EV2, data in the flash memory cells are more likely to be over erased than when using the first erase voltage EV1.

For Example, after the operation of erasing data in the at least one flash memory cell using the second erase voltage EV2 (S652 in FIG. 6), the operation of detecting a flash memory cell whose threshold voltage is less than a first voltage V1 (S654 in FIG. 6) and the operation of increasing the threshold voltage of the detected flash memory cell to a second voltage V2 (S656 in FIG. 6) are performed. However, after the operation of erasing data in the at least one flash memory cell using the first erase voltage EV1 (S632 in FIG. 6), operations corresponding to operations S654 and S656 in FIG. 6 are not performed. Thus, the time taken to erase data in the flash memory cells may be reduced while improving the threshold voltage distribution of the flash memory cells.

Figure 8:
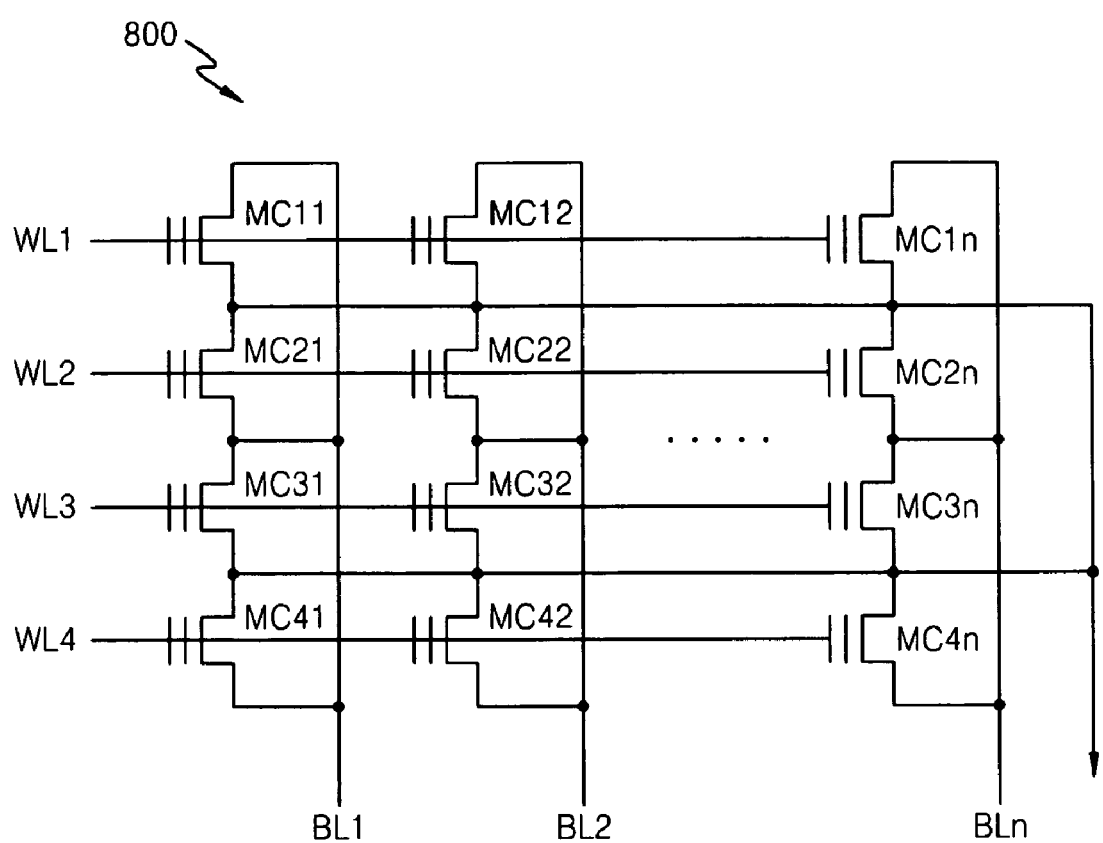

FIG. 8 is a circuit diagram of a flash memory cell array to which the method of FIG. 1 or 6 may be applied, according to the example embodiments. Referring to FIG. 8, a flash memory cell array 800 includes a plurality of flash memory cells MC11, MC12, MC21, MC22, MC31, MC32, MC41, MC42, MC1n, MC2n, MC3n, and MC4n that are disposed in an array. The plurality of flash memory cells MC11, MC12, MC13, MC21, MC22, MC31, MC32, MC41, MC42 MC1n, MC2n, MC3n, and MC4n may be implemented as flash memory cell transistors. Word lines WL1, WL2, WL3 and WL4, and bit lines BL1, BL2, . . . , BLn cross each other and are connected to the plurality of flash memory cells MC11, MC12, MC21, MC22, MC31, MC32, MC41, MC42, MC1n, MC2n, MC3n, and MC4n.

An example of applying the method of erasing data in a flash memory device described with reference to FIG. 1 will be described. The operation of detecting at least one flash memory cell whose threshold voltage is less than a first voltage V1 (S140 in FIG. 1) may be performed on all the flash memory cells connected to the same bit line.

For example, whether the threshold voltages of the flash memory cells MC11, MC21, MC31 and MC41 connected to a single bit line (for example, BL1) is less than a first voltage V1 may be verified. The flash memory cells MC11, MC21, MC31 and MC41 may be simultaneously or sequentially verified. Alternatively, the flash memory cells MC11, MC21, MC31, MC41, MC12, MC22, MC32 and MC42 connected to at least two bit lines (for example, BL1 and BL2) may be simultaneously or sequentially verified.

The operation of increasing the threshold voltage of the flash memory cell that is less than a first voltage V1 to a second voltage V2 (S160 in FIG. 1) may be performed on all the flash memory cells connected to the same bit line or belonging to the same sector. Hereinafter, the flash memory cell MC22 is assumed as having a threshold voltage that is less than the first voltage V1.

For example, because the flash memory cell MC22 is connected to the bit line BL2, the threshold voltages of all the flash memory cells MC12, MC22, MC32 and MC42 connected to the bit line BL2 may be varied to the second voltage V2. Alternatively, in addition to the threshold voltages of the flash memory cells MC12, MC22, MC32 and MC42 connected to the bit line BL2, the threshold voltages of the flash memory cells MC11, MC21, MC31 and MC4 connected to the bit line BL1 adjacent to the bit line BL2 to which the flash memory cell MC22 is connected may be varied to the second voltage V2. Furthermore, the threshold voltages of the flash memory cells that belong to the same sector as the flash memory cell MC22 may be varied to the second voltage V2.

The operation of increasing the threshold voltage of the flash memory cell that is less than a first voltage V1 to a second voltage V2 (S160 in FIG. 1) may be performed on all the flash memory cells connected to the same word line.

For example, when the flash memory cell MC22 is detected as having a threshold voltage that is less than the first voltage V1, the threshold voltages of all the flash memory cells MC21, MC22, . . . , MC2n connected to the word line WL2 may be increased to the second voltage V2 by applying the second voltage V2 to the word line WL2.

Figure 9:
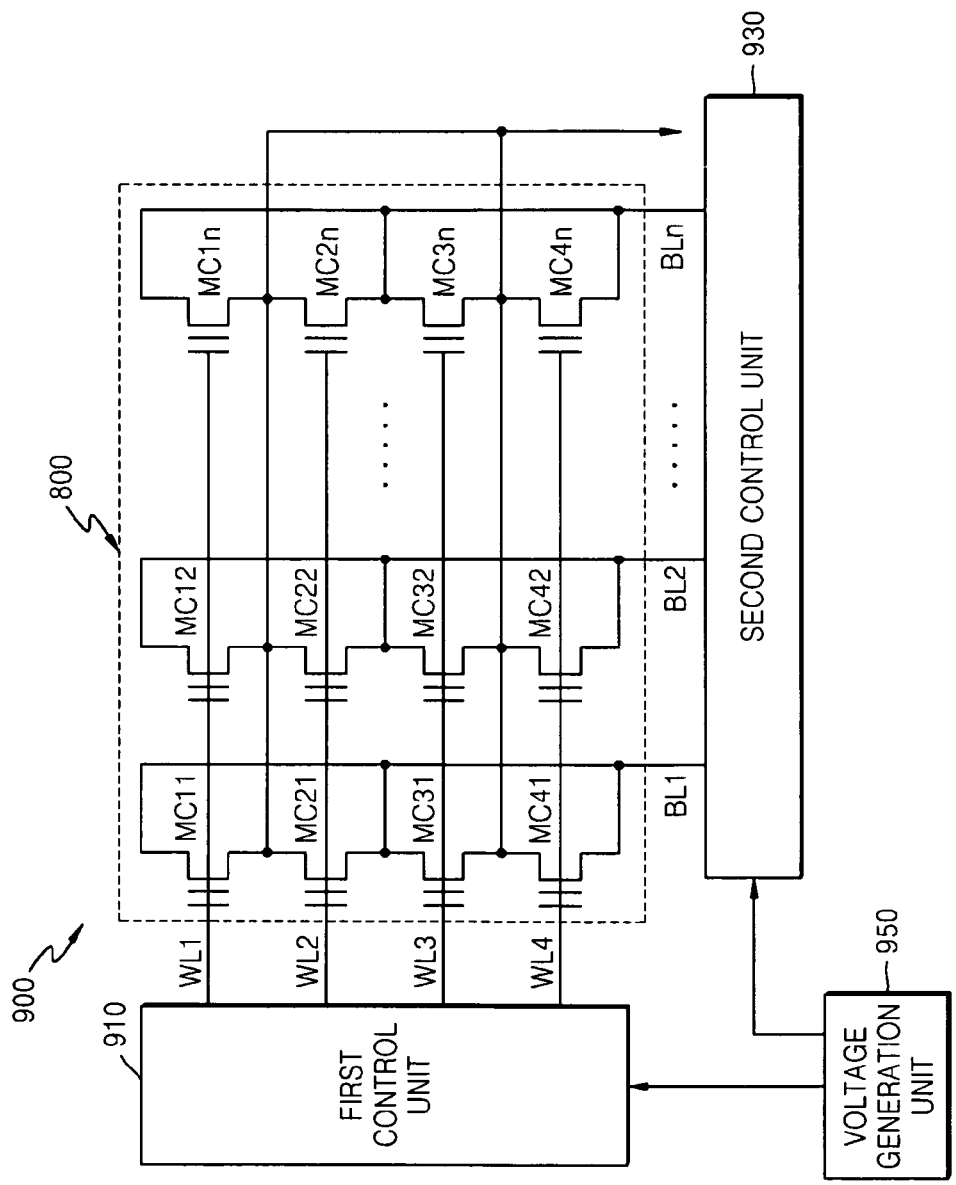

FIG. 9 is a block diagram of a flash memory device according to an example embodiment. Referring to FIG. 9, a flash memory device 900 includes a flash memory cell array 800, a first control unit 910, a second control unit 930, and a voltage generation unit 950.

The first control unit 910 applies either the first voltage V1 or the second voltage V2 to the gates of the flash memory cells MC11, MC12, MC21, MC22, MC31, MC32, MC41, MC42, MC1n, MC2n, MC3n and MC4n of the flash memory cell array 800 through the word lines WL1, WL2, WL3 and WL4.

The second control unit 930 applies either a Vcc voltage or a ground voltage to the bit lines BL1, BL2, . . . , BLn.

The voltage generation unit 950 generates the first voltage V1, the second voltage V2, the Vcc voltage and the ground voltage, and provides the first voltage V1 and the second voltage V2 to the first control unit 910 and the Vcc voltage and the ground voltage to the second control unit 930. The flash memory cells described above may be NOR flash memory cell transistors.

Such a nonvolatile flash memory device as described in the above example embodiment may be installed in a memory card that supports a large data storage capacity or in an information processing system, e.g., a mobile device and a desk top computer.

Figure 10:
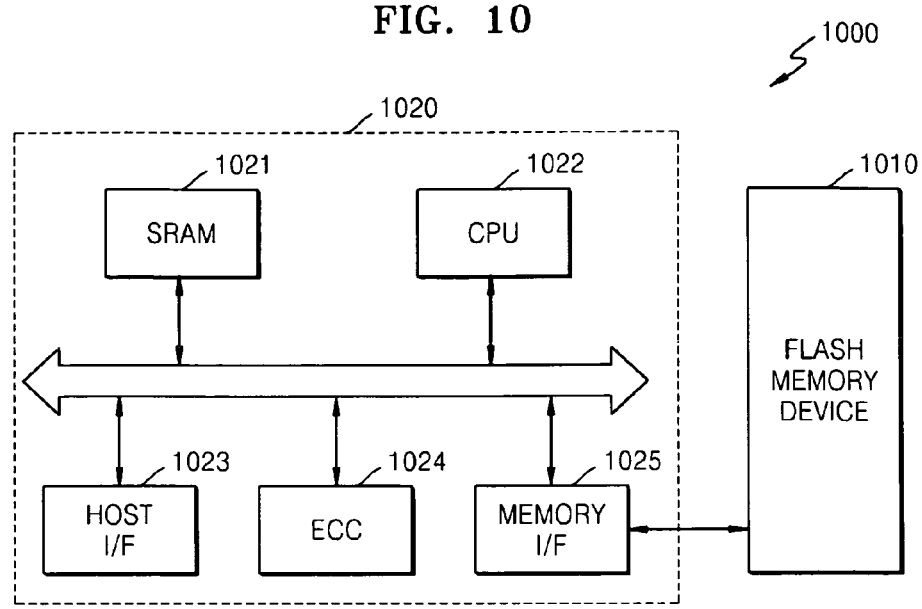

FIG. 10 is a block diagram of a memory card according to an example embodiment. Referring to FIG. 10, in a memory card 1000 a flash memory device 1010 may be installed. The memory card 1000 may include a memory controller 1020 that controls data exchange between a host and the flash memory device 1010.

An SRAM 1021 is used as an operation memory for a central processing unit (CPU) 1022. A host interface 1023 includes a data exchange protocol for the host connected to the memory card 1000. An error correction block (ECC) 1024 detects and corrects an error in data read from the flash memory device 1010. A memory interface 1025 interfaces with the flash memory device 1010. The CPU 1022 controls all data exchange operations of the memory controller 1020. Although not illustrated in FIG. 10, the memory card 1000 according to example embodiments may further include a ROM that stores code data for interfacing with the host.

Figure 11:
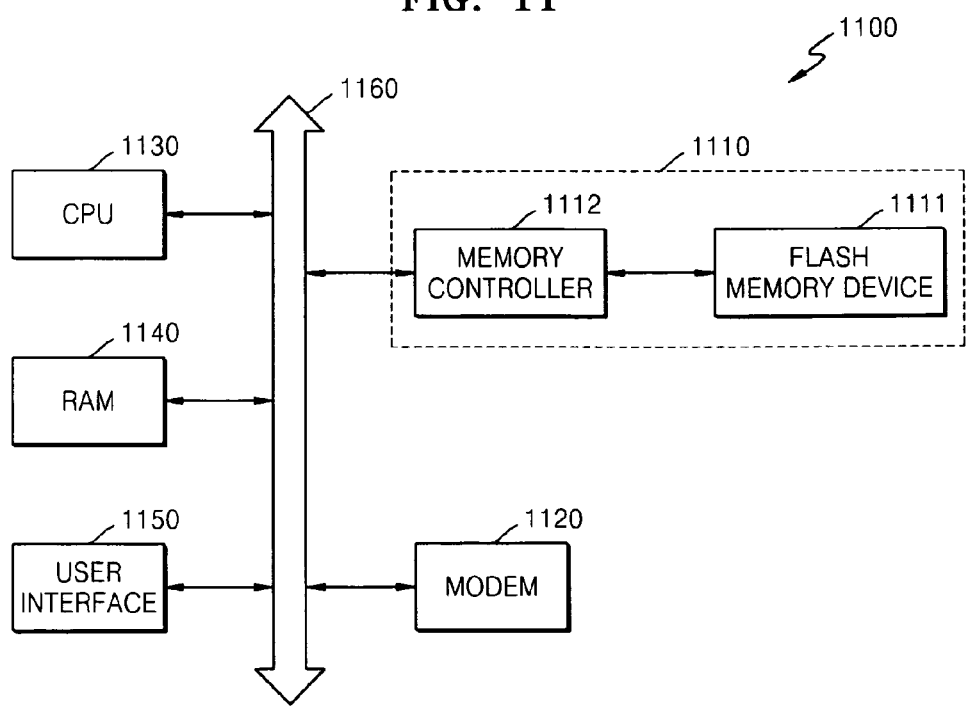

The flash memory device and the memory card according to example embodiments described above may be used in a memory system, e.g., a solid-state disk (SSD) device. FIG. 11 is a block diagram of an information processing system according to example embodiments.

Referring to FIG. 11, an information processing system 1100 according to example embodiments may include a flash memory device 1111. The flash memory device 1111 and a memory controller 1112 may be a component of a non-volatile memory system 1100. The information processing system 1100 includes a modem 1120, a central processing unit (CPU) 1130, a RAM 1140, and a user interface 1150, that are electrically connected to the non-volatile memory system 1110 and a system bus. The non-volatile memory system 1110 stores data processed in the CPU 1130 or externally input data.

The non-volatile memory system 1110 may be implemented as a SSD device. In this case, the information processing system 300 may stably store a large amount of data in the non-volatile memory system 1110. The non-volatile memory system 1110 requires fewer resources for error corrections as its reliability improves, and thus can provide the information processing system 1100 with a high-speed data exchange function. Although not illustrated, the information processing system 1100 according to example embodiments may further include, for example, an application chipset, a camera image processor, an input and an output device.

In addition, the flash memory device, according to the example embodiments, may be mounted as a package. Examples of package forms for the flash memory device include a PoP (Package on Package), a Ball grid array (BGA), a Chip scale package (CSP), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), and the like.

While example embodiments have been particularly shown and described, it will be understood by one of ordinary skill in the art that variations in form and detail may be made therein without departing from the spirit and scope of the claims.

What is claimed is:

1. A method of erasing data in a flash memory device, the method comprising:
   erasing data in at least one flash memory cell using a first erase voltage;
   detecting whether the at least one flash memory cell has a threshold voltage less than a first voltage;
   programming the at least one flash memory cell by varying the threshold voltage of the at least one flash memory cell using a second voltage that is greater than the first voltage if the detecting step detects the threshold voltage is less than the first voltage;
   maintaining the threshold voltage of the at least one flash memory cell if the detecting step detects the threshold voltage is greater than the first voltage; and
   verifying the at least one flash memory cell using a first verification voltage.

2. The method of claim 1, further comprising:
   repeating the erasing step, the detecting step, the programming step, the maintaining step and the verifying step if the verifying step does not verify the at least one flash memory cell.

3. The method of claim 2, wherein
   during the repeating of the erasing step, the at least one flash memory cell is erased using a second erase voltage that is different from the first erase voltage, and
   during the repeating of the verifying step, the at least one flash memory cell is verified using a second verification voltage that is different from the first verification voltage.

4. The method of claim 3, wherein
   the second erase voltage that is less than the first erase voltage, and
   the second verification voltage that is greater than the first verification voltage.

5. The method of claim 1, further comprising:
   repeating only the erasing step and the verifying step if the verifying step determines the at least one flash memory cell includes a defective flash memory cell.

6. The method of claim 5, wherein
   during the repeating of the erasing step, the at least one flash memory cell is erased using a second erase voltage that is different from the first erase voltage, and
   during the repeating of the verifying step, the at least one flash memory cell is verified using a second verification voltage that is different from the first verification voltage.

7. The method of claim 6, wherein
   the second erase voltage that is less than the first erase voltage, and
   the second verification voltage that is greater than the first verification voltage.

8. The method of claim 1, wherein the detecting step includes,
   applying the first voltage to a word line connected to a gate of the at least one flash memory cell, and
   determining whether the threshold voltage of the flash memory cell is less than the first voltage based on whether a current flows through the flash memory cell.

9. The method of claim 1, wherein the first voltage is a ground voltage.

10. The method of claim 1, wherein the at least one flash memory cell is connected to at least one bit line.

11. The method of claim 1, wherein the programming step includes varying the threshold voltage of the at least one flash memory cell by applying the second voltage to a word line connected to a gate of the at least one flash memory cell.

12. The method of claim 1, wherein the second voltage is greater than a ground voltage.

13. The method of claim 1, wherein the second voltage is associated with one of,
   the threshold voltage of one of flash memory cells connected to a same bit line as the at least one flash memory cell,
   the threshold voltage of one of the flash memory cells connected to the same bit line as the at least one flash memory cell and the threshold voltage of flash memory cells connected to a bit line adjacent to the bit line to which the at least one flash memory cell is connected, and
   the threshold voltage of flash memory cells that belong to a same flash memory sector as the at least one flash memory cell.

14. The method of claim 13, wherein the programming of the at least one flash memory cell, among the flash memory cells that are connected to the bit line adjacent to the bit line or that belong to the same flash memory sector as the at least one flash memory cell includes, varying the threshold voltages of all the flash memory cells that are connected to a same word line as the at least one flash memory cell to the second voltage.

15. The method of claim 1, further comprising:
   programming the at least one flash memory cell using a programming voltage before the erasing step.

16. The method of claim 1, further comprising:
   programming the at least one flash memory cell using a programming voltage after the verifying step has been completed.

17. The method of claim 1, wherein the at least one flash memory cell is a NOR flash memory cell.

18. A method of erasing data in a flash memory device, the method comprising:
   erasing data in at least one flash memory cell using a first erase voltage;
   verifying the at least one flash memory cell using a first verification voltage;
   erasing the data in the at least one flash memory cell using a second erase voltage;
   detecting whether the at least one flash memory cell has a threshold voltage less than a first voltage;
   programming the at least one flash memory cell by varying the threshold voltage of the at least one flash memory cell using a second voltage that is greater than the first voltage if the detecting step detects the threshold voltage is less than the first voltage;
   maintaining the threshold voltage of the at least one flash memory cell if the detecting step detects the threshold voltage is greater than the first voltage; and
   verifying the at least one flash memory cell using a second verification voltage.

19. The method of claim 18, further comprising:
   repeating the erasing step using the second erase voltage, the detecting step, the programming step, the maintaining step and the verifying step using the second verification voltage if the verifying step using the second verification voltage determines the at least one flash memory cell includes a defective flash memory cell.

20. The method of claim 18, further comprising:
repeating only the erasing step using the second erase voltage and the verifying step using the second verification voltage if the verifying step using the second verification voltage determines the at least one flash memory cell includes a defective flash memory cell.

21. The method of claim 18, further comprising:
repeating, only the erasing step using the first erase voltage and the verifying step using the first verification voltage if the verifying step using the first verification voltage determines that the at least one flash memory cell includes a defective flash memory cell.

22. The method of claim 18, wherein the detecting step includes,
applying the first voltage to a gate of each of the at least one flash memory cell, and
determining whether the threshold voltage of the flash memory cell is less than the first voltage based on determining if a current flows through the flash memory cell.

23. The method of claim 18, wherein the programming step includes, varying the threshold voltage of the flash memory cell by applying the second voltage to a gate of the at least one flash memory cell.

24. The method of claim 18, wherein the detecting step is simultaneously or sequentially performed on all the flash memory cells connected to a same bit line as the at least one flash memory cell.

25. The method of claim 18, wherein the second voltage is associated with one of,
the threshold voltage of one of flash memory cells connected to a same bit line as the at least one flash memory cell,
the threshold voltage of one of flash memory cells connected to the same bit line as the at least one flash memory cell and the threshold voltage of flash memory cells connected to a bit line adjacent to the bit line to which the at least one flash memory cell is connected, and
the threshold voltage of flash memory cells that belong to a same flash memory sector as the at least one flash memory cell.

26. The method of claim 18, further comprising:
programming the at least one flash memory cell using a first programming voltage before the erasing step using the first erase voltage; and
programming the at least one flash memory cell using a second programming voltage after the verifying step using the second verification voltage has been completed on all of the flash memory cells.

27. A memory card, comprising:
a flash memory array; and
a memory controller configured to:
  erase data in at least one flash memory cell of the flash memory array using a first erase voltage,
  detect whether the at least one flash memory cell has a threshold voltage less than a first voltage,
  program the at least one flash memory cell by varying the threshold voltage of the at least one flash memory cell using a second voltage that is greater than the first voltage if the detected threshold voltage is less than the first voltage,
  maintain the threshold voltage of the at least one flash memory cell if the detected threshold voltage is greater than the first voltage, and
  verify the at least one flash memory cell using a first verification voltage.

28. A system comprising:
a bus;
a non-volatile memory system connected to the bus, the non-volatile memory system including,
  a flash memory array, and
  a memory controller configured to:
    erase data in at least one flash memory cell of the flash memory-array using a first erase voltage,
    detect whether the at least one flash memory cell has a threshold voltage less than a first voltage,
    program the at least one flash memory cell by varying the threshold voltage of the at least one flash memory cell using a second voltage that is greater than the first voltage if the detected threshold voltage is less than the first voltage,
    maintain the threshold voltage of the at least one flash memory cell if the detected threshold voltage is greater than the first voltage, and
    verify the at least one flash memory cell using a first verification voltage;
a random access memory connected to the bus;
a user interface connected to the bus;
a modem connected to the bus; and
a central processing unit connected to the bus, the central processing unit configured to communicate with the non-volatile memory system, the random access memory, the user interface and the modem via the bus.

* * * * *